(12) United States Patent
Kodama

(10) Patent No.: US 10,608,627 B2
(45) Date of Patent: Mar. 31, 2020

(54) APPARATUS FOR DRIVING INDUCTIVE LOAD

(71) Applicant: KABUSHIKI KAISHA TOYOTA JIDOSHOKKI, Kariya-shi, Aichi (JP)

(72) Inventor: Kazuya Kodama, Aichi-ken (JP)

(73) Assignee: KABUSHIKI KAISHA TOYOTA JIDOSHOKKI, Kariya-shi, Aichi-ken (JP)

( * ) Notice: Subject to any disclaimer, the term of this patent is extended or adjusted under 35 U.S.C. 154(b) by 0 days.

(21) Appl. No.: 16/191,583

(22) Filed: Nov. 15, 2018

(65) Prior Publication Data

US 2019/0165777 A1    May 30, 2019

(30) Foreign Application Priority Data

Nov. 28, 2017 (JP) .................................. 2017-228083

(51) Int. Cl.
| | |
|---|---|
| *H03K 7/08* | (2006.01) |
| *H03K 17/082* | (2006.01) |
| *H02M 3/155* | (2006.01) |
| *H02M 1/00* | (2006.01) |
| *B60T 8/36* | (2006.01) |

(52) U.S. Cl.
CPC ........ *H03K 17/0822* (2013.01); *H02M 3/155* (2013.01); *H03K 7/08* (2013.01); *B60T 8/36* (2013.01); *H02M 2001/0009* (2013.01); *H02M 2003/1555* (2013.01)

(58) Field of Classification Search
CPC ..... H03K 17/0822; H03K 7/08; H02M 3/155; H02M 2001/0009; H02M 2003/1555; H02M 2001/0019; B60T 8/36
See application file for complete search history.

(56) References Cited

U.S. PATENT DOCUMENTS

2007/0159143 A1*  7/2007 Yang .................. H02M 3/33523
                                                         323/247

FOREIGN PATENT DOCUMENTS

| JP | 2002-023869 A | 1/2002 |
|---|---|---|
| JP | 2006-252416 A | 9/2006 |
| JP | 2012-078217 A | 4/2012 |
| JP | 02-180007 A | 7/2012 |

OTHER PUBLICATIONS

Communication dated May 9, 2019, from the European Patent Office in counterpart European Application No. 18204551.8.

* cited by examiner

*Primary Examiner* — Jung Kim
(74) *Attorney, Agent, or Firm* — Sughrue Mion, PLLC

(57) ABSTRACT

An apparatus for driving an inductive load, includes a switching element provided in a current flowing path of the inductive load, a diode connected to the inductive load in parallel, a current detecting resistor detecting current flowing through the inductive load, a peak hold circuit holding voltage detected by the current detecting resistor when the switching element is on, when the switching element is off, and a control section controlling current flowing through the inductive load by turning on/off of the switching element at a duty ratio in response to a target current value while the control section performs feedback control of output of the peak hold circuit. The control section controls current that flows through the inductive load when the duty ratio is larger than a threshold value and controls voltage that applies to the inductive load when the duty ratio is smaller than the threshold value.

3 Claims, 4 Drawing Sheets

APPARATUS FOR DRIVING INDUCTIVE LOAD

BACKGROUND ART

The present disclosure relates to an apparatus for driving an inductive load.

Japanese Patent Application Publication No. H02-180007 discloses an apparatus for driving an inductive load. The apparatus for driving the inductive load includes a switching element for driving the inductive load and a current detecting resistor. The apparatus for driving the inductive load converts current flowing through the inductive load via the current detecting resistor to a voltage signal corresponding to the current. Then, to control on/off operation of the switching element, the comparator of the apparatus for driving the inductive load compares the voltage detected by the current detecting resistor with a comparative voltage that is determined so that the voltage detected by the current detecting resistor coincides with the voltage corresponding to a target current. The control circuit of the apparatus for driving the inductive load inputs the voltage detected by the current detecting resistor, which corresponds to the current flowing through the current detecting resistor and digitally controls a duty ratio of the switching element.

Since the switching element drives the inductive load on the high side of the current flowing path of the inductive load, current flowing through the inductive load can be always detected. However, when the switching element drives the inductive load on the low side of the current flowing path of the inductive load and while the switching element is off, current flows through the inductive load by the commutation due to the counter electromotive voltage of the inductive load (reactor). While the switching element is off, current cannot be detected by the current detecting resistor because no current flows through the current detecting resistor. Japanese Patent Application Publication No. 2012-78217 discloses a peak hold circuit so that current flowing through inductive load is continuously detected during off-period of the switching element as well as during on-period of the switching element. The peak hold circuit may be provided between the current detecting resistor and the control circuit, so that the control circuit can detect current flowing through the inductive load based on the output from the peak hold circuit during off-period of the switching element. Specifically, referring to FIG. 5, a switching element 101 and a current detecting resistor 102 are provided in the current flowing path of an inductive load 100. A peak hold circuit 105 is provided between a drive circuit 104 and an amplifier circuit 103 that is connected to the current detecting resistor 102.

As shown in FIG. 5, in the circuit including the peak hold circuit 105 for driving the switching element 101 on the low side of the current flowing path of the inductive load 100, the time constant of the driven inductive load 100 may come closer to the discharge time constant of the peak hold capacitor 105a, with the result that the accuracy of current control can increase. However, the accuracy of current control may deteriorate in the region where the target current value and the duty ratio are small due to the variations of the current detecting resistor 102, the amplifier circuit 103, the peak hold capacitor 105a, and a peak hold resistor 105b.

The present disclosure is directed to providing an apparatus for driving an inductive load, which can drive the inductive load precisely in a region where the duty ratio is small.

SUMMARY

In accordance with an aspect of the present disclosure, there is provided an apparatus for driving an inductive load, including a low-side switching element provided in a current flowing path of the inductive load connected to a DC power supply, a flywheel diode connected to the inductive load in parallel, a current detecting resistor provided on a lower voltage side than the inductive load in the current flowing path of the inductive load for detecting current flowing through the inductive load, a peak hold circuit inputting voltage corresponding to current flowing through the inductive load via the current detecting resistor when the switching element is on and holding the voltage inputted via the current detecting resistor when the switching element is on, when the switching element is off, and a control section performing current control to control current flowing through the inductive load by turning on/off of the switching element at a duty ratio in response to a target current value while the control section performs feedback control of output of the peak hold circuit. The control section performs current control of the inductive load when the duty ratio is larger than a threshold value and performs voltage control of the inductive load when the duty ratio is smaller than the threshold value.

Other aspects and advantages of the disclosure will become apparent from the following description, taken in conjunction with the accompanying drawings, illustrating by way of example the principles of the disclosure.

BRIEF DESCRIPTION OF THE DRAWINGS

The disclosure together with objects and advantages thereof, may best be understood by reference to the following description of the embodiments together with the accompanying drawings in which.

DETAILED DESCRIPTION OF THE EMBODIMENTS

Figure 1:
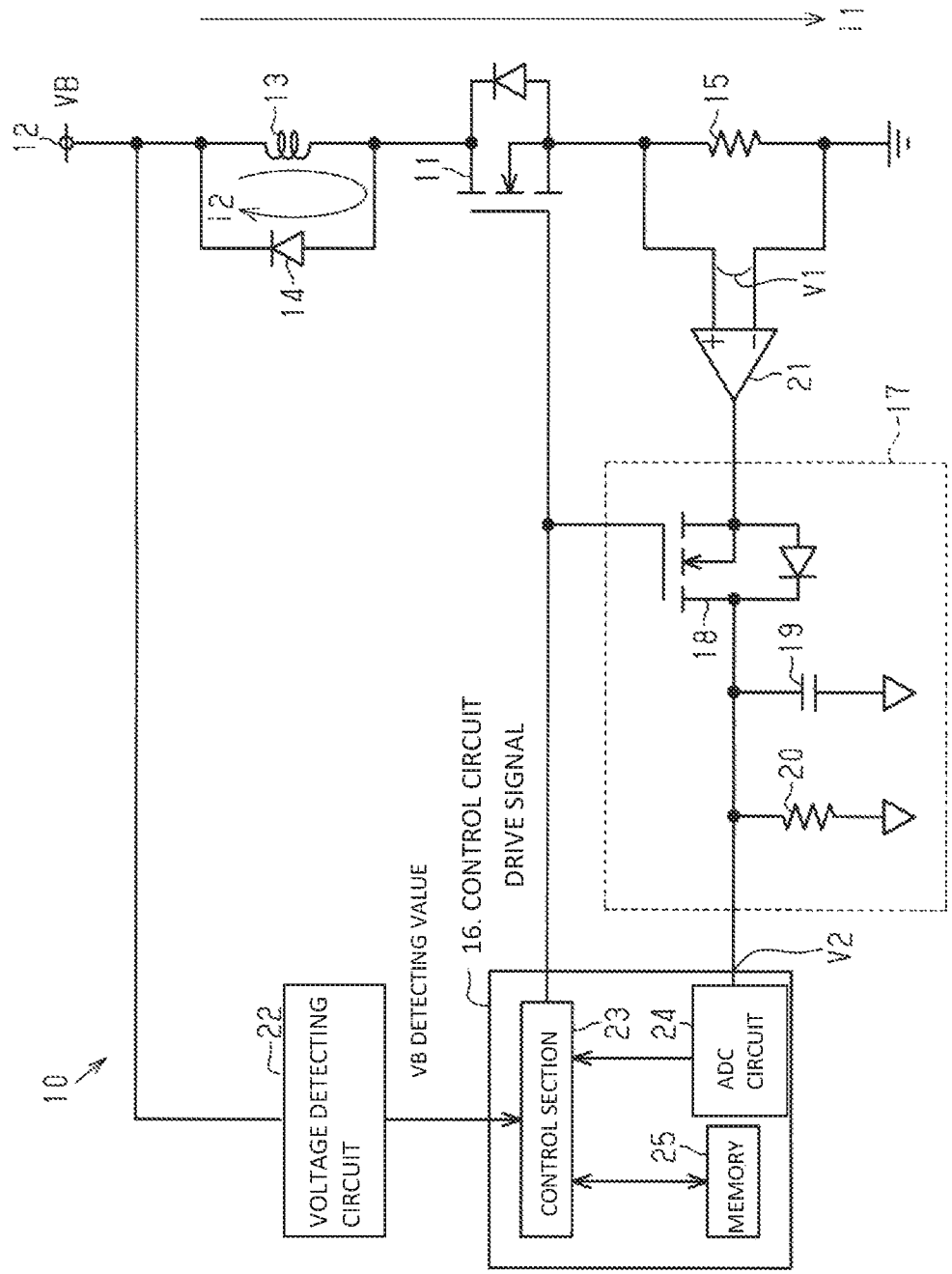
FIG. 1 is a circuit diagram showing an apparatus for driving an inductive load according to an embodiment in the present disclosure.

The following will describe an apparatus for driving an inductive load according to an embodiment of the present disclosure with the accompanying drawings. Referring to FIG. 1, an apparatus 10 for driving an inductive load (hereinafter referred to as apparatus 10) is mounted in an industrial vehicle such as a battery-powered forklift truck. The apparatus 10 includes a switching element 11 for driving an inductive load 13, a flywheel diode 14, a current detecting resistor 15, a control circuit 16, a peak hold circuit 17, an amplifier circuit 21, and a voltage detecting circuit 22.

A battery 2 serves as a DC power supply and is a 48-volt electrical system. The circuit between the battery 12 and the ground forms a current flowing path of the inductive load 13. In the present embodiment, the switching element 11 is consisted of a MOSFET. The switching element 11 is provided in the current flowing path of the inductive load 13 connected to the battery 12 as the DC power supply. Specifically, the switching element 11 is a low-side switching element that is provided between the inductive load 13 and the ground in the current flowing path of the inductive load 13.

The inductive load 13 is consisted of a brake coil or a relay coil and has an inductance component and a resistance component. When the inductive load 13 is consisted of the brake coil of a battery-powered forklift truck, a current command value serves as a target current value. The current command value is variable. A plurality of the current command values is set. For example, different current command values (target current values) are set for when the vehicle stops and for when the vehicle travels.

When the switching element 11 turns on, current i1 flows through the inductive load 13. The gate terminal of the switching element 11 is connected to the control circuit 16. The control circuit 16 drives signals to control on-off operation of the switching element 11.

The flywheel diode 14 is connected to the inductive load 13 in parallel. The cathode of the flywheel diode 14 is connected to the inductive load 13 on the side of the battery 12. The anode of the flywheel diode 14 is connected to the inductive load 13 on the side of the switching element 11. When the switching element 11 turns off, current i2 flows between the flywheel diode 14 and the inductive load 13 due to the commutation caused by the counter electromotive force of the inductive load 13 (reactor).

The current detecting resistor 15 is provided on the lower voltage side than the inductive load 13 in the current flowing path of the inductive load 13 for detecting current that flows through the inductive load 13. Specifically, the current detecting resistor 15 is provided between the source terminal of the switching element 11 and the ground in the current flowing path of the inductive load 13.

The input terminal of the amplifier circuit 21 is connected across both ends of the current detecting resistor 15 and amplifies the voltage of both ends of the current detecting resistor 15, corresponding to the current i1 that flows through the inductive load 13 to output the amplified voltage. The peak hold circuit 17 includes a MOSFET 18 for peak hold (hereinafter referred to as MOSFET 18), a charge and discharge capacitor 19 (peak hold capacitor), and a discharge resistor 20 (peak hold resistor).

The control circuit 16 is connected to the gate terminal of the MOSFET 18. The control circuit 16 drives signals to control on-off operation of the MOSFET 18. The MOSFET 18 performs switching operation in synchronization with the switching element 11 for driving the inductive load 13.

The output terminal of the amplifier circuit 21 is connected to the source terminal of the MOSFET 18. The drain terminal of the MOSFET 18 is connected to the ground through the charge and discharge capacitor 19. The discharge resistor 20 is connected to the charge and discharge capacitor 19 in parallel.

When the MOSFET 18 turns on, the charge and discharge capacitor 19 is charged. When the MOSFET 18 turns off, the charge of the electric charge and discharge capacitor 19 is discharged through the discharge resistor 20.

The peak hold circuit 17 inputs voltage (amplified voltage across both ends of the current detecting resistor 15) corresponding to the current i1 that flows through the inductive load 13 via the current detecting resistor 15 from the amplifier circuit 21 when the switching element 11 is on and holds the voltage (amplified voltage across both ends of the current detecting resistor 15) inputted via the current detecting resistor 15 when the switching element 11 is on, when the switching element 11 is off. That is, since no current flows through the current detecting resistor 15 and current cannot be detected while the switching element 11 is off, the peak hold circuit 17 is provided between the control circuit 16 and the amplifier circuit 21 (current detecting resistor 15) to detect current when the switching element 11 is off.

The voltage detecting circuit 22 is provided to detect the voltage of the battery 12. The voltage detecting value of the battery 12 that is detected by the voltage detecting circuit 22 is digitally encoded and sent to the control circuit 16.

The control circuit 16 includes a control section 23 consisted of a micro-computer, an analog-digital converter circuit 24 (hereinafter referred to as ADC circuit 24), and a memory 25. The ADC circuit 24 is connected to the charge and discharge capacitor 19 that is connected to the output of the peak hold circuit 17 and converts analog signals corresponding to current that flows through the inductive load 13 to digital signals for output. The control section 23 outputs drive signals to the switching element 11 and the MOSFET 18. The control section 23 inputs digital data corresponding to current that flows through the inductive load 13 from the ADC circuit 24.

The control section 23 consisted of the micro-computer needs to monitor current that flows through the inductive load 13, at a predetermined cycle. Therefore, the control section 23 inputs digital data corresponding to current that flows through the inductive load 13 based on the output from the peak hold circuit 17 while the switching element 11 is off so that current flowing through the inductive load 13 is continuously detected during off-period of the switching element 11 as well as during on-period of the switching element 11.

The control section 23 detects a battery voltage detecting value outputted from the voltage detecting circuit 22. The control section 23 controls the duty ratio of the switching element 11 based on the input voltage of the inductive load 13 so that the target current value flows through the inductive load 13. Specifically, the control section 23 performs current control to control current that flows through the inductive load 13 by turning on/off of the switching element 11 at the duty ratio in response to the target current value while the control section 23 performs feedback control of the output of the peak hold circuit 17.

Figure 3:
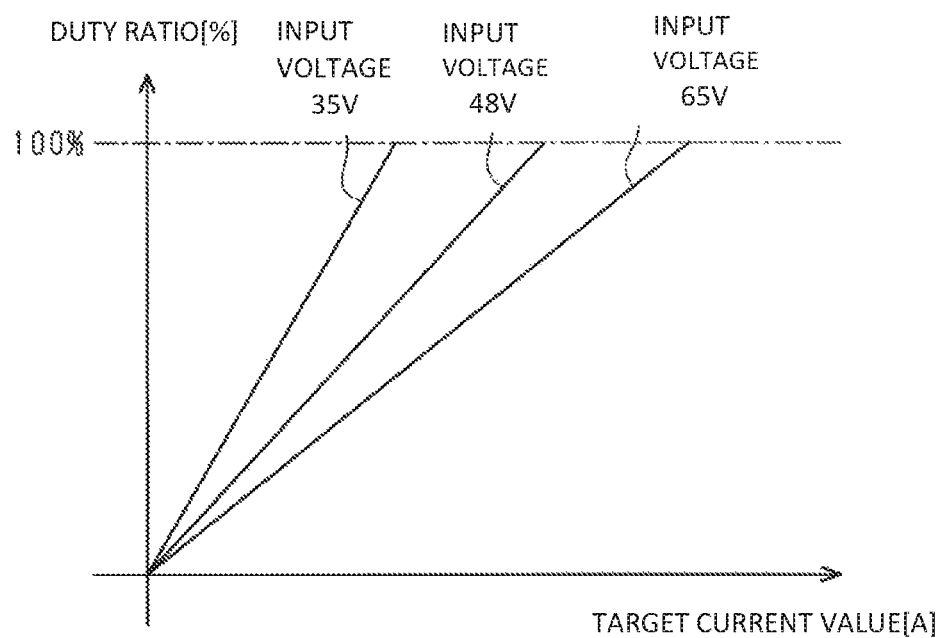
FIG. 3 is a graph showing the relationship between a target current value and a duty ratio in the apparatus for driving the inductive load of FIG. 1.

The memory 25 stores a map data showing the relationship between the target current value and the duty ratio at each input voltage (battery voltage) as shown in FIG. 3. The control section 23 preforms current control of the inductive load 13 when the target current value is large and the duty ratio is larger than a threshold value (see FIG. 4) and performs voltage control of the inductive load 13 when the target current value is small and the duty ratio is smaller than the threshold value, based on the relationship between the target current value and the duty ratio at each input voltage, which are stored in the memory 25. That is, when the battery voltage and the resistance of the inductive load 13 are determined, the accuracy of current is secured by voltage control.

Figure 2:
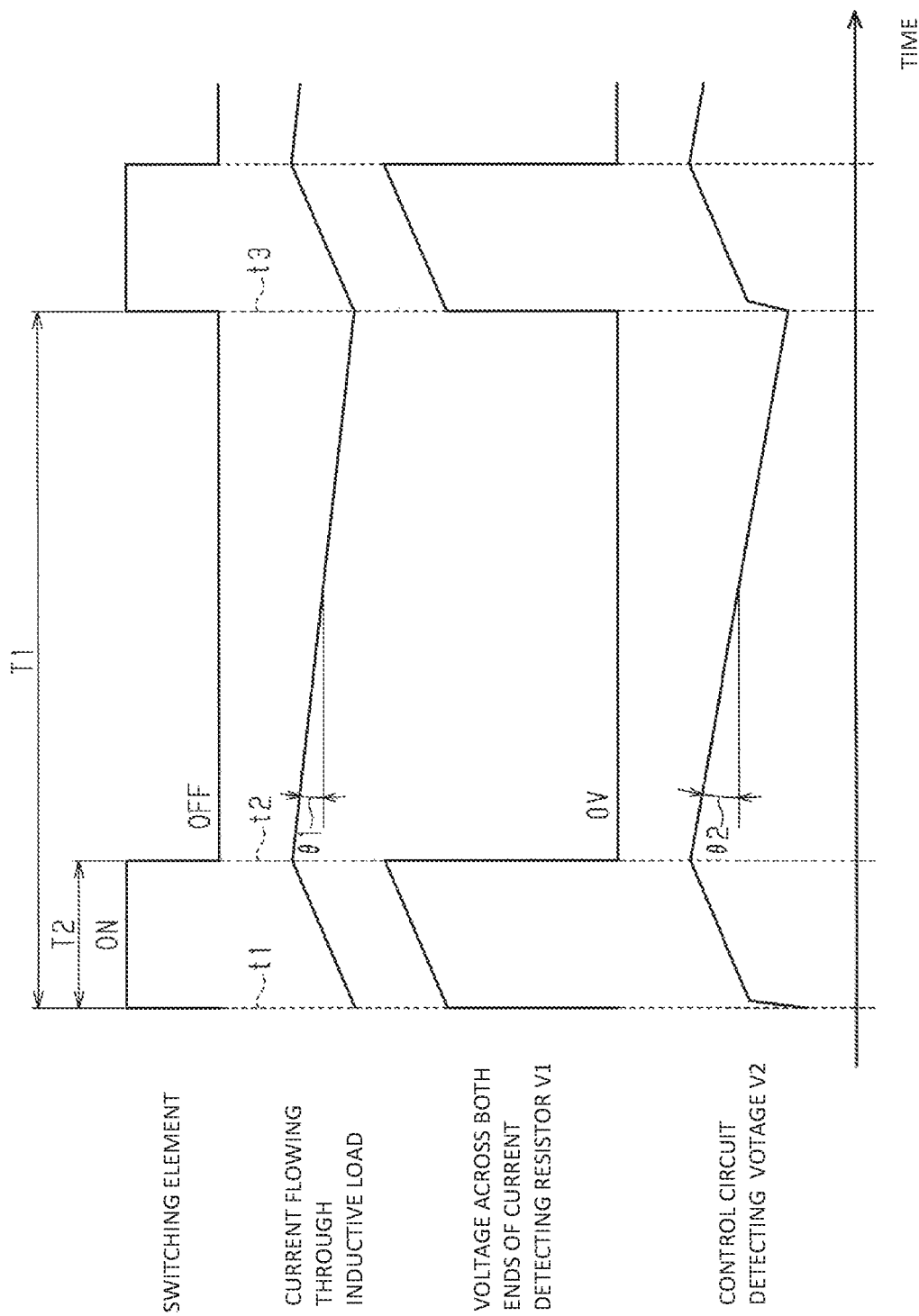
FIG. 2 is a timing chart showing an on/off status of a switching element, a current flowing through the inductive load, a voltage across both ends of a current detecting resistor, and a control circuit detecting voltage in the apparatus for driving the inductive load of FIG. 1.

The following will describe the function and the principle of the apparatus 10 according to the present embodiment referring to FIG. 2. As shown in FIG. 2, the switching element 11 turns on/off. Specifically, the switching element 11 turns on at the timing t1, off at the timing t2, and on at the timing t3. The cycle T1 is a period from the timing t1 to the timing t3 and denotes one cycle. The on-period T2 is a period from the timing t1 to the timing t2. When the cycle T1 and the on-period T2 are given, the duty ratio is determined by an expression, T2/T1.

When the switching element 11 turns on at the timing t1, current i1 flows through the inductive load 13. The current i1 flows through the current detecting resistor 15. In the period from the timing t1 to the timing t2, in which the switching element 11 is on, the current flows in a saw-tooth shape having the inclination of the time constant that is determined by the reactance and the resistance of the inductive load 13. In the period from the timing t1 to the timing t2, in which the switching element 11 is on, the voltage V1 across the both ends of the current detecting resistor 15 has the same waveform as the current in the saw-tooth shape.

The amplifier circuit 21 amplifies the voltage V1 across the both ends of the current detecting resistor 15. Since the MOSFET 18 turns on in synchronization with the switching element 11, the charge and discharge capacitor 19 is charged with electric charge.

When the switching element 11 turns off at the timing t2, current i2 flows through the inductive load 13 due to the commutation caused by the counter electromotive force of the inductive load 13. While the switching element 11 is off, no current flows through the current detecting resistor 15. Therefore, while the switching element 11 is off from the timing t2 to the timing t3, the voltage V1 across the both ends of the current detecting resistor 15 becomes zero. While the switching element 11 is off from the timing t2 to the timing t3, the current i2 flows through the inductive load 13 by the counter electromotive force caused by the energy stored in the reactance of the inductive load 13.

Since the MOSFET 18 is off, the electric charge stored in the charge and discharge capacitor 19 is discharged in the discharge resistor 20. Therefore, the control circuit 16 detects a control circuit detecting voltage V2 having the waveform of the inclination $\theta 2$ of the time constant that is determined by the charge and discharge capacitor 19 and the discharge resistor 20.

While the switching element 11 is off, the voltage that the control circuit 16 detects depends on the time constant that is determined by the charge and discharge capacitor 19 and the discharge resistor 20. Therefore, the inclination of the voltage that the control circuit 16 detects does not coincide with that of the current that flows through the inductive load 13. That is, as shown in FIG. 2, the inclination $\theta 1$ of the current that flows through the inductive load 13 does not coincide with the inclination $\theta 2$ of the control circuit detecting voltage V2 ($\theta 1 \neq \theta 2$). As a result, as the drive frequency of the switching element 11 and the duty ratio become smaller, the accuracy of current control deteriorates.

As shown in FIG. 3, the input voltages are 35V, 48V, and 65V. For example, when the battery charge is completed, the input voltage is 65V. When the discharge of the battery proceeds or the performance of the battery deteriorates, the input voltage becomes 35V. In the same target current value, as the input voltage becomes larger, the duty ratio becomes smaller.

Figure 4:
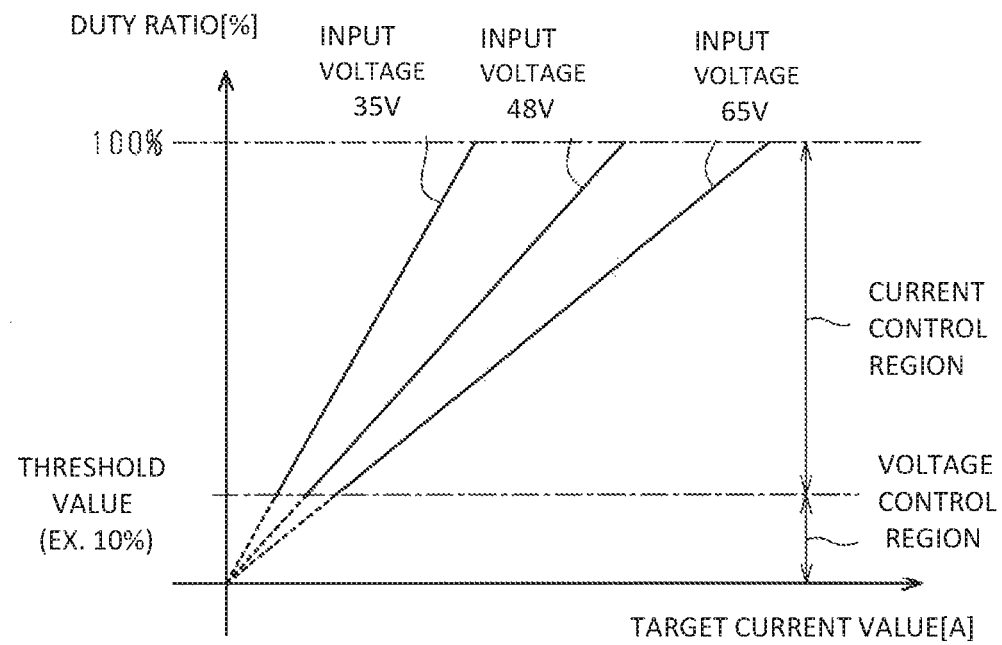
FIG. 4 is a graph showing the relationship of the target current value and the duty ratio with a threshold value of the duty ratio in the apparatus for driving the inductive load of FIG. 1.
Figure 5:
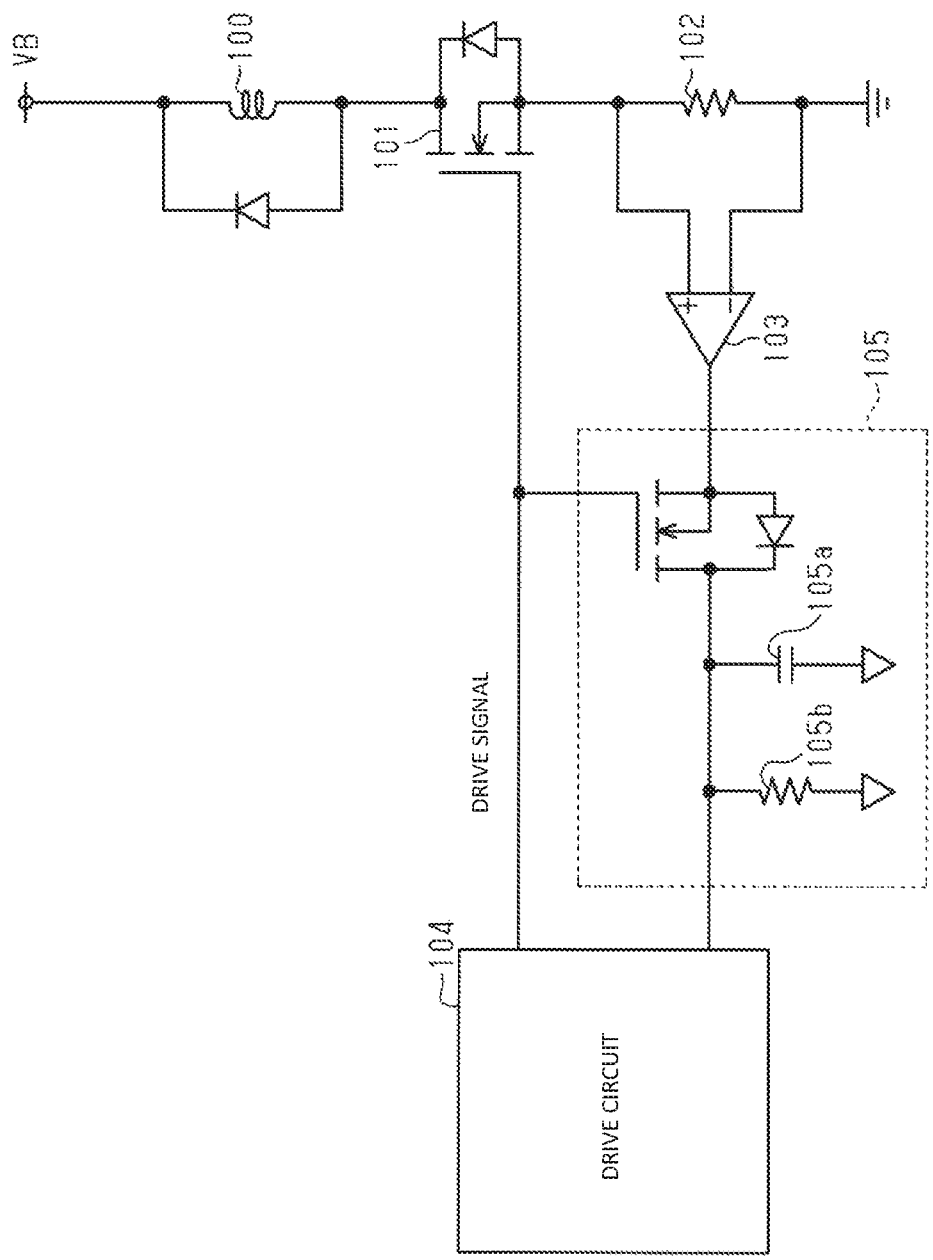
FIG. 5 is a circuit diagram showing an apparatus for driving an inductive load for the explanation of a background art and a problem.

In the present embodiment, as the duty ratio becomes smaller, the error of current control becomes larger. Therefore, as shown in FIG. 4, when the duty ratio becomes smaller than a threshold value, or when the on-period becomes smaller, the control method is shifted to voltage control such that the switching element 11 is driven at a predetermined duty ratio (fixed value). Thus, the error from the target current value is reduced. The threshold value is a predetermined fixed value and, for example, 10%. That is, since the time constant calculated by the reactance and the resistance of the driven inductive load is determined, the time constant can be regarded as a fixed value. In the operation of voltage control, the duty ratio is determined by the constant (reactance and resistance) of the inductive load 13 and the battery voltage VB detected by the voltage detecting circuit 22. The on/off control of the switching element 11 is performed at the duty ratio.

Specifically, the memory 25 stores the map data of the relationship between the target current value and the duty ratio that is determined based on the reactance and the resistance of the inductive load 13 at each input voltage. The switching method of the switching element 11 is shifted to voltage control in response to the duty ratio. Instead of the map data, the relationship between the target current value and the duty ratio at each input voltage may be calculated by the reactance and the resistance of the inductive load 13.

That is, as shown in FIG. 4, in the relationship between the duty ratio and the target current value at each input voltage for shifting the control method, when the duty ratio is larger, or when the target current value is larger, the switching operation is performed by current control. When the duty ratio is smaller, the switching operation is performed by voltage control. As a result, the accuracy of the current value can be secured.

Thus, the accuracy of the current that flows through the inductive load 13 can be improved by shifting the switching method. That is, the resistance of the inductive load 13 is measured in advance and voltage control is performed while the battery voltage is detected, so that the accuracy of the current can be secured. The memory 25 can store the reactance and the resistance of the inductive load 13 in advance, so that even if the specification of the inductive load 13 is changed, only the software for control may be changed without the increase of the number of the elements.

When the duty ratio becomes smaller than the threshold value and the control section 23 performs voltage control of the inductive load 13, the control section 23 inputs the target current value that is the current command value and the battery voltage measured currently and calculates the duty ratio based on the battery voltage, or the voltage of the DC power supply and the target current value by the map data stored in the memory. The control section 23 returns voltage control of the inductive load 13 to current control based on the calculated duty ratio. That is, when the calculated duty ratio is larger than the threshold value, the control section 23 returns to current control of the inductive load 13.

The apparatus for driving the inductive load, according to the present embodiment has the following advantageous effects.

(1) As the configuration of the apparatus 10, the control section 23 can perform current control to control current that flows through the inductive load 13 by turning on/off of the switching element 11 at the duty ratio in response to the target current value while the control section 23 performs feedback control of the output of the peak hold circuit 17. When the duty ratio is larger than a threshold value, the control section 23 performs current control of the inductive load 13. When the duty ratio is smaller than the threshold value, the control section 23 performs voltage control of the inductive load 13. Therefore, when the control section 23 performs current control in the region where the duty ratio is small, the accuracy of current can be prevented from being deteriorated and the control section 23 can drive the inductive load 13 precisely in the region where the duty ratio is small.

(2) Since the peak hold circuit 17 has the charge and discharge capacitor 19 and the discharge resistor 20, the peak hold circuit 17 is practical.

(3) When the duty ratio becomes smaller than a threshold value and the control section 23 performs voltage control of the inductive load 13, the control section 23 returns to current control of the inductive load 13 if the duty ratio calculated based on the battery voltage, or the voltage of the DC power supply and the target current value is larger than the threshold value. Therefore, the control section 23 is practical.

The embodiment is not limited to the above embodiment, but may be exemplified as follows.

The MOSFET is used as the switching element 11, but is not limited to this example. For example, a device such as a bipolar transistor and an IGBT may be used as the switching element 11.

The MOSFET 18 is used in the peak hold circuit 17, but is not limited to this example. For example, a diode may be used instead of the MOSFET 18. The peak hold circuit 17 may do without the MOSFET 18.

The apparatus 10 is mounted on a battery-powered forklift truck, but may be mounted on any other vehicles.

What is claimed is:

1. An apparatus for driving an inductive load, comprising:
   a low-side switching element provided in a current flowing path of the inductive load connected to a DC power supply;
   a flywheel diode connected to the inductive load in parallel;
   a current detecting resistor provided on a lower voltage side than the inductive load in the current flowing path of the inductive load for detecting current flowing through the inductive load;
   a peak hold circuit inputting voltage corresponding to current flowing through the inductive load via the current detecting resistor when the switching element is on and holding, when the switching element is off, the voltage inputted via the current detecting resistor when the switching element is on; and
   a control section performing current control to control current flowing through the inductive load by turning on/off of the switching element at a duty ratio in response to a target current value while the control section performs feedback control of output of the peak hold circuit,
   wherein the control section performs current control of the inductive load when the duty ratio is larger than a threshold value and performs voltage control of the inductive load when the duty ratio is smaller than the threshold value.

2. The apparatus for driving the inductive load, according to claim 1, wherein the peak hold circuit includes a charge and discharge capacitor and a discharge resistor.

3. The apparatus for driving the inductive load, according to claim 1, wherein when the duty ratio becomes smaller than the threshold value and the control section performs voltage control of the inductive load, the control section returns to current control of the inductive load if a duty ratio calculated based on voltage of the DC power supply and the target current value is larger than the threshold value.

* * * * *